United States Patent [19]

Shou et al.

[11] Patent Number: 5,872,466
[45] Date of Patent: Feb. 16, 1999

[54] MATCHED FILTER CIRCUIT

[75] Inventors: Guoliang Shou; Changming Zhou; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 686,950

[22] Filed: Jul. 26, 1996

[30] Foreign Application Priority Data

Jul. 28, 1995 [JP] Japan .................................. 7-212517

[51] Int. Cl.$^6$ ........................................................ H03K 5/00
[52] U.S. Cl. .......................... 327/552; 327/94; 327/344; 327/361; 333/172; 330/109; 330/306
[58] Field of Search .............................. 327/94, 333, 552, 327/361, 337, 336, 345, 407; 330/294, 306, 109; 333/172

[56] References Cited

U.S. PATENT DOCUMENTS

| | | | |
|---|---|---|---|
| 4,453,132 | 6/1984 | Stamler | 330/109 |
| 4,507,746 | 3/1985 | Fletcher, Jr. | 364/717 |
| 5,388,063 | 2/1995 | Takatori | 364/724.17 |
| 5,396,446 | 3/1995 | Shou | 364/825 |
| 5,408,192 | 4/1995 | Bailey | 327/254 |
| 5,500,810 | 3/1996 | Shou | 364/724.01 |
| 5,502,664 | 3/1996 | Shou | 364/724.16 |
| 5,563,812 | 10/1996 | Shou | 364/606 |

OTHER PUBLICATIONS

Nauerz et al., "The Suitability of Modern CMOS Gate Array Circuits as Corelators and Matched Filters for Spread–Spectrum Signals", IEEE, vol. 2 of 3, pp. 473–478, 1987 no month.

Primary Examiner—Timothy P. Callahan
Assistant Examiner—Dinh T. Le
Attorney, Agent, or Firm—Cushman, Darby & Cushman IP Group of Pillsbury, Madison & Sutro LLP

[57] ABSTRACT

A matched filter with reduced electric power consumption is disclosed. The matched filter circuit power consumption is reduced by stopping the electric power supply to an unnecessary circuit since input signal is partially sampled just after an acquisition. Since the spreading code is 1 bit data string, the input signal sampled and held is branched out into the signal groups "1" and "–1" by a multiplexer. The signals in each groups are added in parallel by a capacitive coupling, and the electric power is supplied in the circuit intermittently.

10 Claims, 6 Drawing Sheets

MATCHED FILTER CIRCUIT

FIELD OF THE INVENTION

The present invention relates to a matched filter circuit, especially to a matched filter effective for a spread spectrum communication system for mobile cellular radio and wireless LAN.

BACKGROUND OF THE INVENTION

A matched filter is a filter for judging the identification between two signals. In spread spectrum communication, each user who receives a signal processes the received signal by a matched filter using spreading code allocated for the user to find a correlation peak for acquisition and holding.

Here, assuming that the spreading code is d(i), sampling interval is $\Delta t$, a length of diffusion code is N, a received signal before a time t is $x(t-i\Delta t)$, and a correlation output y(t) of matched filter is as in formula (1). In formula (1), d(i) is a data string of 1 bit data.

$$y(t) = \sum_{l=0}^{N-1} d(i) \times (t - i\Delta t) \quad (1)$$

Figure 14:
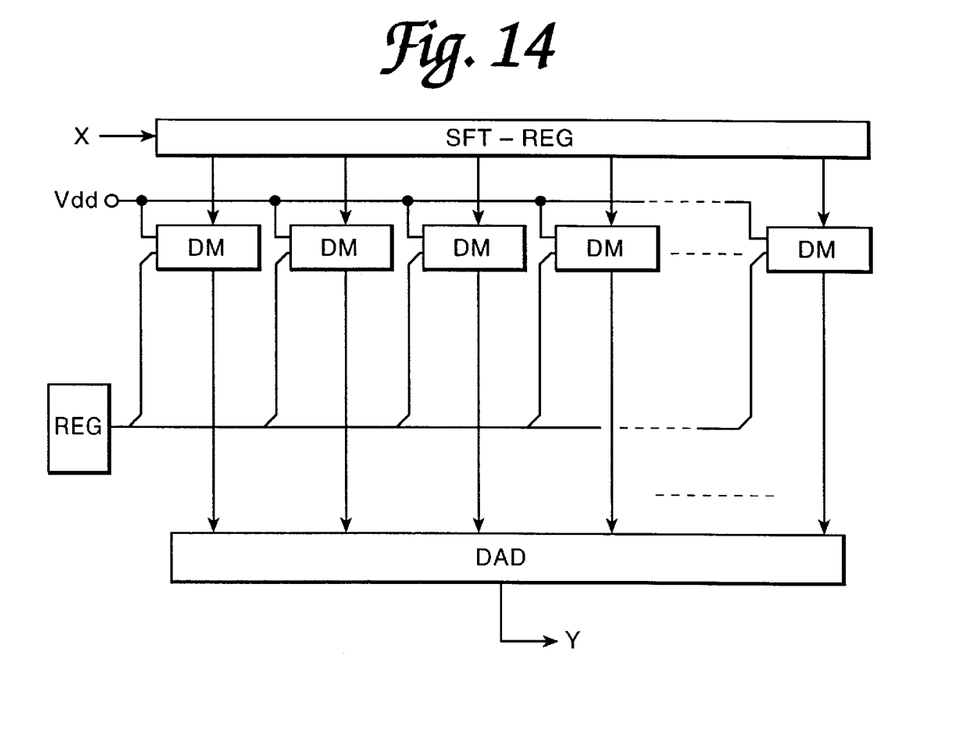
FIG. 14 shows a diagram of a conventional digital matched filter circuit.

A conventional matched filter circuit is described herein. In a digital circuit in FIG. 14, digitized input signal X is held in a shift register SFT-REG and shifted, then, a multiplier registered in a register REG is multiplied to a input signal on the predetermined sample timing by a plurality of digital multiplying portions DM. The outputs of multiplying portions are added by a digital adder DAD. These operations correspond to the formula (1). For the acquisition, double or higher order of sampling is necessary. In such a case, a structure with many circuits of FIG. 14 are required. Consequently, the size of the whole circuit to large and has high electric power consumption. It is a serious defect. Though a circuit of SAW device was used, the total circuits cannot be incorporated within one LSI and make S/N ratio low.

Figure 15:
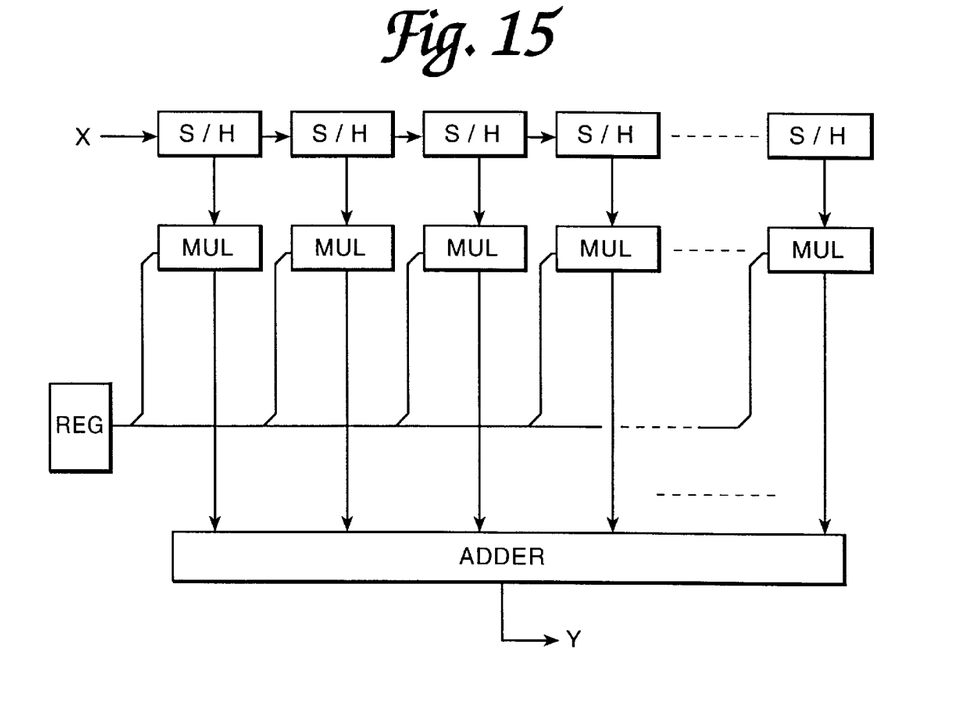
FIG. 15 shows a diagram of an analog type matched filter as background technology.

The applicant of the present invention proposes a matched filter circuit by an analog circuit in FIG. 15 in Japanese publication patent numbers 06-2839070, 06-296120, 06-314952 and 07-6190. The Electric power consumption was reduced by a circuit with a multiplier MUL and an adder ADDER of voltage driven type using a capacitive coupling. However recently, portable communication terminal is expected to reduce further electric power consumption.

SUMMARY OF THE INVENTION

The present invention solves the above conventional problems and has an object to provide a matched filter with further reduced electric power requirement.

In a matched filter circuit according to the present invention, the electric power supply is stopped with respect to an unnecessary circuit according to our experience that signal is partially sampled just after the acquisition. Since the spreading code is 1 bit data string, the input signal sampled and held is branched out into the signal groups "1" and "−1" by a multiplexer. The signals in each groups are added in parallel by a capacitive coupling, and the electric power is supplied in the circuit intermittently.

It is possible to control electric power consumption in the minimum by the matched filter circuit according to the present invention.

PREFERRED EMBODIMENT OF THE PRESENT INVENTION

Hereinafter, an embodiment of the matched filter circuit according to the present invention is described with references to the attached drawings.

FIGS. from 1 to 4 show an improvement of the circuit of FIG. 15. The elements of multiplication circuit MUL, addition circuit ADDER and sampling and holding circuits S/H are improved in order to achieve lower electric power consumption.

Figure 1:
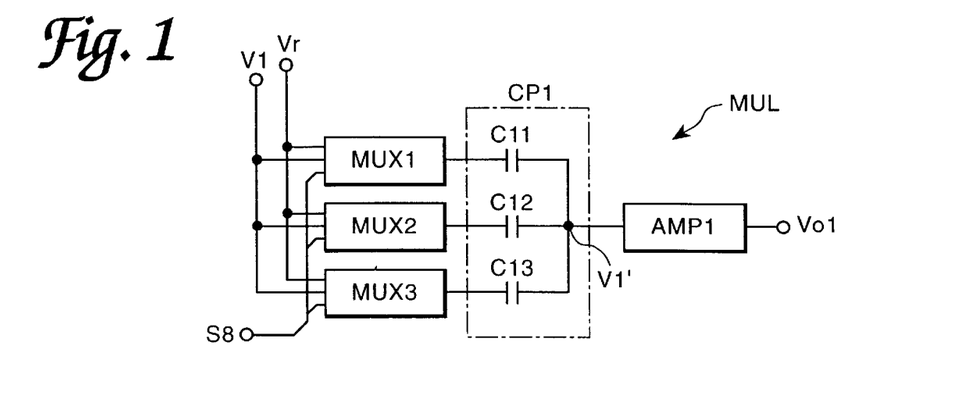
FIG. 1 shows a diagram of multiplication circuit of the first embodiment.

In a multiplication circuit MUL in FIG. 1, for an analog input voltage V1, a plurality of multiplexers from MUX1 to MUX3 are connected in parallel and the outputs of the multiplexers are integrated by capacitive coupling CP1 including capacitances from C11 to C13 parallelly connected. The output of the capacitive coupling CP1 is input to an inverted amplifying portion AMP1. The output of CP1 is output with good linearity whatever electrical charge in the following stage is.

Figure 8:
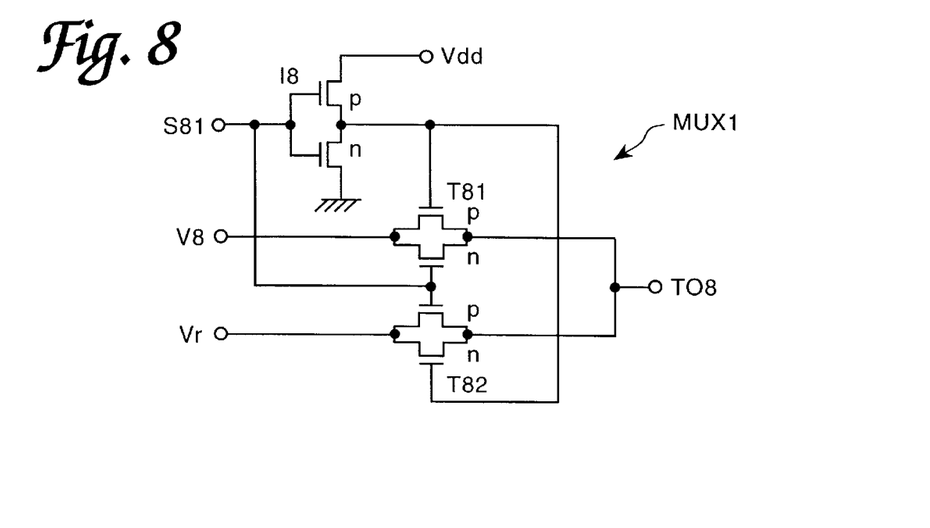
FIG. 8 shows a diagram of a common multiplexer of the second embodiment.

As shown in FIG. 8, the multiplexer includes transistor circuits T81 and T82 each of which includes nMOS and pMOS and drains of the transistors are connected with sources of the other. The source of nMOS of the transistor circuits are connected to a common output T08. The drain of nMOS of the transistor circuits T81 and T82 are connected to input voltages V8 and a reference voltage Vr, respectively.

Signal S81 is input to the gates of nMOS transistor of transistor circuit T81 and of pMOS transistor of transistor circuit T82. A signal inverted from S81 by inverter I8 is input to the gates of pMOS of T81 and nMOS of T82. Then, when S81 is a high level, T81 is conductive and T82 is cut off; and when it is a low level, T82 is conductive and T81 is cut off. MUX1 can alternatively output V8 or Vr by the control of S81.

Multiplexers MUX2 and MUX3 are structured in the same way as MUX1 and are controlled independently from S81. Here, we define the sum of the capacity of capacitances connected V1 as effectively composed capacity EC(CP1), the sum of all the capacitances to be T(CP1), the sum of the capacitances connected to Vr is NL(CP1), and C11:C12:C13=1:2:4.

Figure 4:
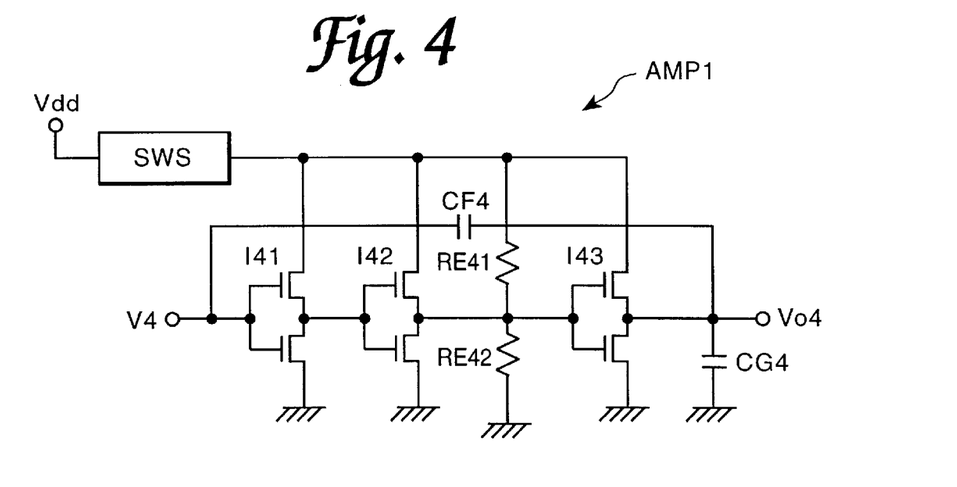
FIG. 4 shows a diagram of an inverted amplifying portion of the embodiment in FIG. 1.

Inverted amplifying portion AMP1 has the structure in FIG. 4. The input voltage V4 is input to an inverter I41 of three stages serial MOS inserters I41, I42 and I43. The output V04 of the last stage MOS inverter I43 is connected to an input of the first stage inverter I41 through a feedback capacitance CF4, and a closed loop gain is defined. The capacitance of the feedback capacitance CF4 is settled equivalent to T(CP1) and the closed loop gain is settled to −1. The output V1' of capacitive coupling CP1 is a constant potential as shown in formula (2). Vr is settled equivalent to V1'.

$$V1' = Vr = \frac{Vdd}{2} \quad (2)$$

From the above, the output Vo1 of a multiplying circuit is, $$Vo1 - V1' = -\frac{EC(CP1)}{T(CP)} (V1 - V1') \quad (3)$$

Inverted amplifying portion AMP1 is connected to the ground through a grounded capacitance CG4, and an output of I42 is connected to the supply voltage and the ground through a pair of balancing resistances RE41 and RE42. Unstable oscillation of the amplifying circuit including a feedback line is prevented by it.

I41, I42, I43, RE41 and RE42 in inverted amplifying portion AMP1 of a multiplying circuit are connected to the supply voltage Vdd through a power switch SWS. Electric power consumption by the MOS inverters is completely stopped by opening the power switch SWS.

Figure 2:
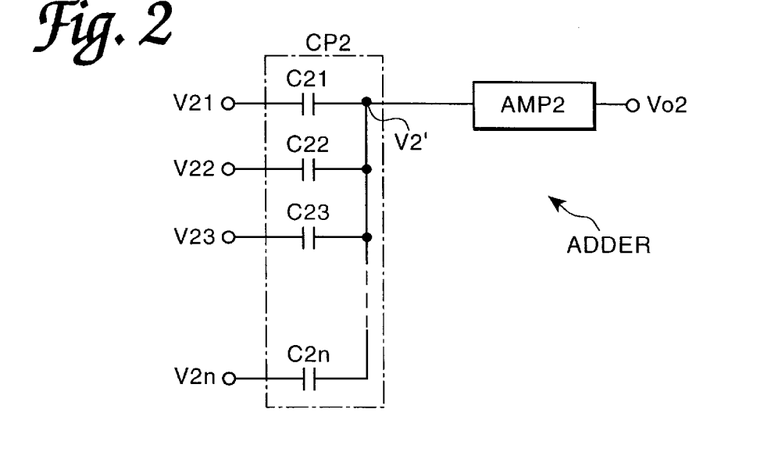
FIG. 2 shows a diagrams addition circuit of the embodiment in FIG. 1.

As shown in FIG. 2, an adder ADDER, consists of capacitive coupling CP2 with a plurality of capacitances from C21 to C2n being connected at its output to an inverted amplifying portion AMP2. A plurality of input voltages from V21 to V2n are connected to C21 to C2n, respectively. The total capacity T(CP2) of capacitive coupling CP2 is defined in the same way as CP1. Here, it is defined that $$C21=C22=C23\ldots=C2n \quad (4)$$

Inverted amplifying portion AMP2 is omitted to be shown in a figure because the structure of it is the same as the one of the inverted amplifying portion of the multiplier MUL. The capacity of the feedback capacitance in the inverted amplifying portion AMP2 is settled equal to T(CP2) and the output Vo2 of the adder is settled so as to he an inversion of the normalized addition below.

$$Vo2 - V2' = -\frac{1}{n} \sum_{i=1}^{n} (V2i - V2') \quad (5)$$

Also in the adder, the power source Vdd of a MOS inverter in the inverted amplifying portion AMP2 can be cut off by a power switch and electric power consumption can be stopped if necessary.

Figure 3:
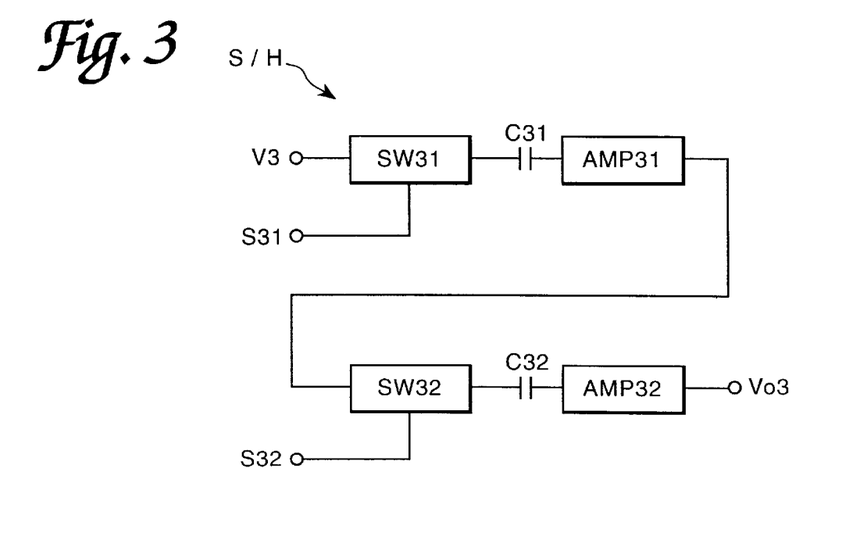
FIG. 3 shows a diagram of sampling and holding circuit of the embodiment in FIG. 1.

As shown in FIG. 3. in a sampling and holding circuit S/H, analog switch SW31, connecting capacitance C31, inverted amplifying portion AMP31, analog switch SW32, capacitance C32 and inverted amplifying portion AMP32 are serially connected, and input voltage V3 is connected to SW31.

Figure 7:
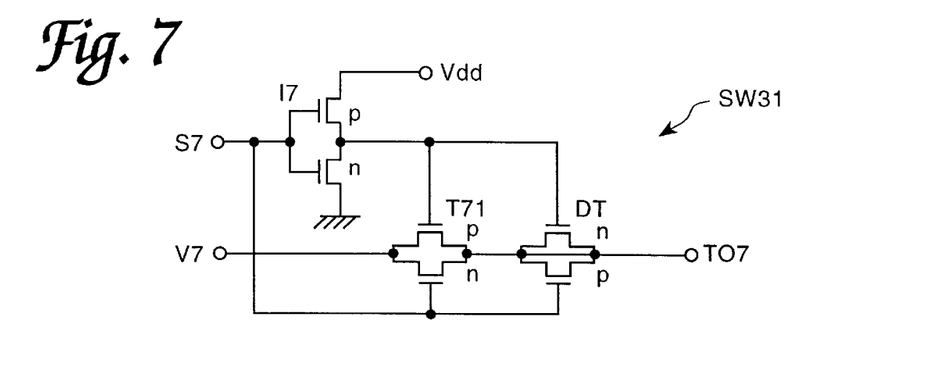
FIG. 7 shows a diagram of a common switch of the first and the second embodiments.

The switch SW31 is illustrated in FIG. 7, in which an input voltage V7 is connected to a drain of nMOS of a transistor circuit T71, and a source of nMOS of T71 is connected to an output terminal To7 through a dummy transistor DT with the similar structure. A signal S71 is input to the gate of nMOS transistor in transistor circuit T71 and a signal inverted from S71 by inverter I7 is input to the gate of pMOS transistor. When S71 is a high level, T71 is conductive, and when it is a low level, T71 is cut off.

When closed, the switch SW31 charges and discharges C31 so that the electric potential of it corresponds to the input voltage V3. The switch SW32 is closed when SW31 is opened, and charges and discharges C32 so that the electric potential of it corresponds to that of C31. It is possible to sample and hold an input voltage and output the held data as an output voltage Vo3 without the influence of an input following to the held input by interlocking cooperation of SW31 and SW32.

AMP31 and AMP32 of inverted-amplifying portion is structured in the same way as AMP1 above. The capacity of feedback capacitances of are settled to be equal to those of connecting capacitances C31 and C32 at the input. It is possible to stably hold electric potential whatever the load in the following stage is.

A MOS inverter and a resistance in inverted amplifying portion AMP31 and AMP32, are connected to the supply voltage Vdd through the switch of voltage supply SWS which stops the electric power consumption when the circuit is not in operation.

A plurality of code sequences called "spreading codes" are defined for each user as a receiver terminal. The matched filter extracts according to the code sequence a signal transmitted to the user. The number of codes included in each spreading code is defined as "spreading ratio" equal to a number of taps or a number of multiplication portions of the matched filter.

On mobile communication, multi-path signals may reach the receiver including a plurality of signal corresponding to one original signal transmitted, which have different phases due to different transfer paths reflections. In such a case a few signals successively received are extracted from the signal string. Therefore, it is not necessary to process by all taps after the signal aquisition of the signal for the terminal. It is necessary to refer all signal until the first aquisition is completed and there is a period when all taps are to be operated. After the aquisition, it is possible to reduce electric power consumption by stopping the work of the inverted amplifying portion AMP1 of the unnecessary multiplication circuits by the switch of supply voltage. Only successive few taps are necessary for receiving the signal to be received among all taps. Number of these taps is called "W" as a width of window. Usually it is about three taps. Additional to the matched filter, a circuit is provided for multiplications of several taps and adding the multiplication result. Only this small circuit works after the first aquisition is completed and matched filter can be stopped. In this case, it is possible to stop the addition circuit and sampling and holding circuits. The power switch of these circuits can be used.

Here, the process of the calculation disclosed above is shown below stepwise.

Step 1-1

Supplying voltage to all SH, MUL and ADD, outputs from Vo11(1) to Vo11 (W) are calculated.

Step 1-2

On the timing of the next Vo11(W+1), power supply for SH(W+1) to SH(N) is stopped and only for SH(1) to SW(W) is continued. At the same timing, sampling and holding of new input Vin are performed by SHW. After completing the holding, power supply for SH(W+1) is started for holding the next data.

Step 1-3

Increasing number of sampling and holding circuits to which the power supply is supplied, up to SH(W+1), SW(W+2), . . . , SH(N−1), new data of Vin are sampled and held one after another.

Step 1-4

On completing the sampling and holding, power supply to MUL and ADD circuits as well as to SH(N) is started.

Step 1-5

Starting sampling and holding of SH(N), then returning to step 1. New calculations from Vo11(1) to Vo11(W) are performed and the steps 1–2 to 1–5 are repeated.

The steps above are shown in Table 1 in the cases of N=8 and W=3. In Table 1, the status of supplied power is shown by "○" and "X". When the power is supplied, "○" is shown.

TABLE 1

Status of Circuits (Voltage is supplied or not.)

| SIGNAL | SH(1) | SH(2) | SH(3) | SH(4) | SH(5) | SH(6) | SH(7) | SH(8) | ADD | MUL |
|---|---|---|---|---|---|---|---|---|---|---|
| Vo11(1) | ○ | ○ | ○ | ○ | ○ | ○ | ○ | ○ | ○ | ○ |
| Vo11(2) | ○ | ○ | ○ | ○ | ○ | ○ | ○ | ○ | ○ | ○ |
| Vo11(3) | ○ | ○ | ○ | ○ | ○ | ○ | ○ | ○ | ○ | ○ |
| Vo11(4) | ○ | ○ | ○ | X | X | X | X | X | X | X |
| Vo11(5) | ○ | ○ | ○ | ○ | X | X | X | X | X | X |
| Vo11(6) | ○ | ○ | ○ | ○ | ○ | X | X | X | X | X |
| Vo11(7) | ○ | ○ | ○ | ○ | ○ | ○ | X | X | X | X |
| Vo11(8) | ○ | ○ | ○ | ○ | ○ | ○ | ○ | X | X | X |

The second embodiment with less power consumption than the first embodiment is described with reference to the drawings.

Figure 5:
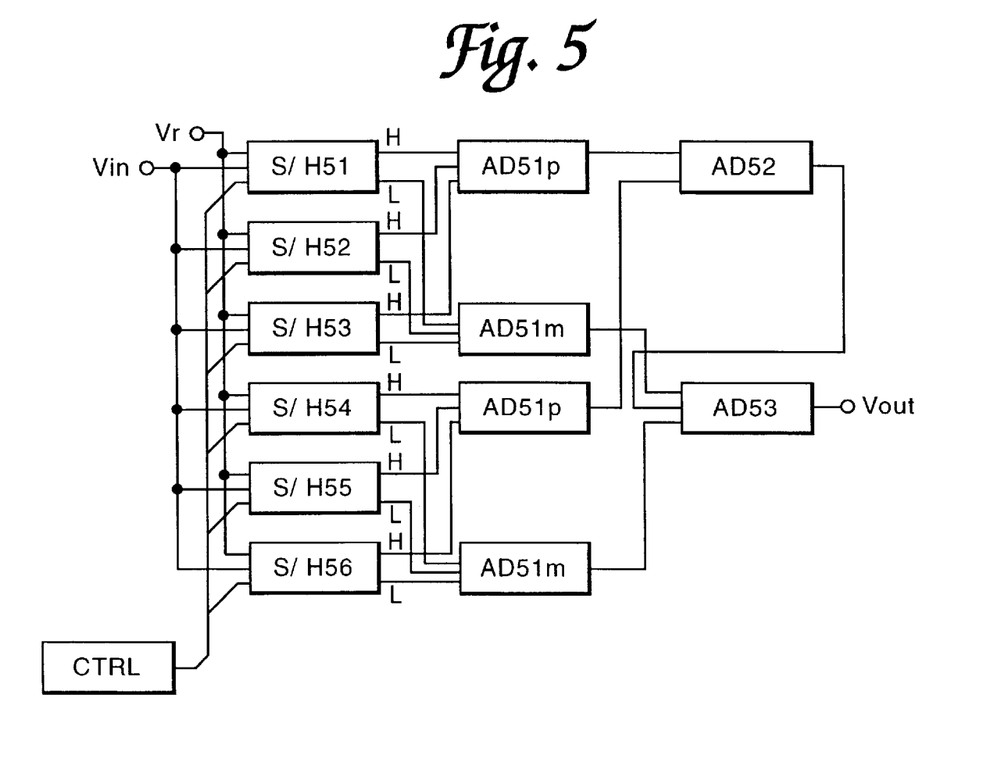
FIG. 5 shows a diagram of a matched filter circuit of the second embodiment.

In FIG. 5, in the matched filter circuit, input voltage Vin (relative to the basis of the reference voltage Vr) is connected in parallel to a plurality of sampling and holding circuits from S/H51 to S/H56. Two types outputs of H(high) and L(low) are output from each sampling and holding circuit. A control circuit CTRL is connected to the sampling and holding circuits, which controls the connection of Vin in order that Vin is sequentially input to one of sampling and holding circuits.

In the sampling and holding circuits; input voltage Vin is introduced to either of H or L, and the reference voltage Vr is connected to other than where Vin is introduced according to the control circuit. This selection of route is performed corresponding to 1 bit code to be multiplied to an input signal. Then, the multiplication is completed.

Figure 6:
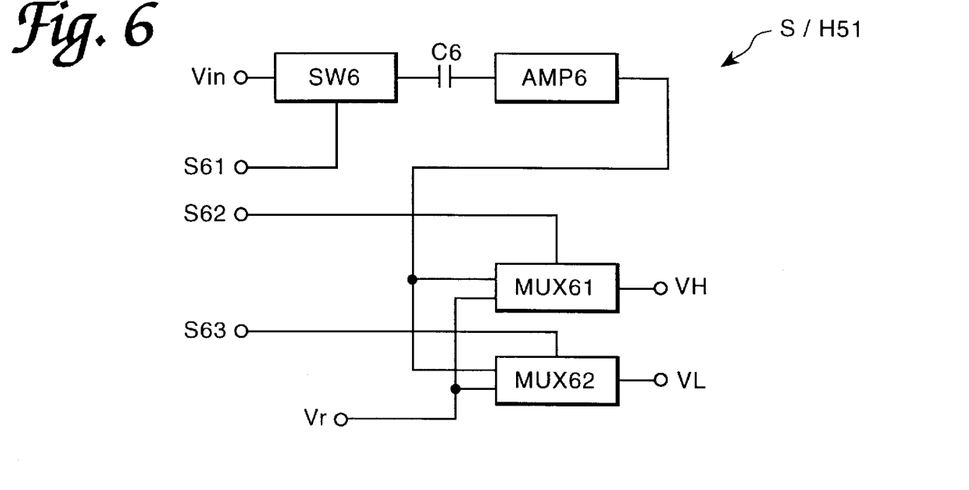
FIG. 6 shows a diagram of a sampling and holding circuit of the second embodiment.

Sampling and holding circuits from S/H51 to S/H56 (They are represented by S/H51 in the FIG. 6.) are structured as in FIG. 6, in which input voltage Vin is connected to a switch SW6 similar to SW31. An output of switch SW6 is connected to the capacitance C6 whose output is connected to inverted amplifying portion AMP6 which is the same as the inverted amplifying portion AMP1. An output of AMP6 is input to two multipliers MUX61 and MUX62 similar to the multiplexer MUX1. The common reference voltage Vr is connected to the multiplexers. When SW6 is closed, C6 is charged by the electrical charge corresponding to Vin and the linearity of the output is guaranteed by the feedback function of AMP6. When the switch SW6 is opened after it, the sampling and holding circuit S/H51 holds Vin.

A switch SW6, multiplexers MUX61 and MUX62 are controlled by control signal S61, S62 and S63, S61 opens the SW6 on the timing of receiving input voltage after it is once closed. S62 and S63 are inverted signals. When a multiplexer outputs Vin, another one outputs Vr. MUX61 and MUX62 generate outputs of "H" and "L" above, respectively. The H and L correspond to spreading codes "1" and "−1". When code "1" is multiplied to an input voltage, Vin is output from MUX61, and when "−1" is multiplied, Vin is output from MUX62.

The signal S62 corresponds to the spreading code. When S62=1, 1×V1=V1 is output to AD51p. At the same time, S63 is −1, and an output Vr corresponding to 0 is output to AD51m. When S62=1, Vr corresponding to 0 is output AD51p. At this time, S63 is −1, and an output 1×V1=V1 is output to AD51m.

Expressing the receiving signal corresponding to input signal Vin on a time t to be Vin(t), and X(t) in the formula (1) to be Vin(t), formula (6) is true.

$$y(t) = \sum_{i=0}^{N-1} d(i)\text{Vin}(t - i\Delta t) \tag{6}$$

Terms (Vin(t−iΔr) in the formula are the input voltages held in each sampling and holding circuit, and d(i) is the signal S62 (spreading code) to be input to each sampling and holding circuit. The spreading code is constant for the order of signal held on a time interval. On the timing to input a new signal, a new signal is input instead of the oldest signal. At the input, the relationship between circuits S/H51 to S/H56 and the data d(i) is shifted, therefore, control circuit shifts d(i) relative to the sampling and holding circuits. If the code supply for S/H51 to S/H56 is not shifted, a signal (data) between (S/H)s is transmitted and an error is caused on the transmission. That is, it is effective to shift a code to prevent an error at data transmission.

The accumulation in the formula (6) Is executed in the addition portions AD51p, AD51m, AD52 and AD53, in which output voltage VH and VL of each sampling and holding circuit are accumulated in AD53 and AD52, respectively. These accumulations are not straightly executed. Dividing from S/H51 to S/H56 into a plurality of groups, the outputs VH and VL are once accumulated in AD51p and AD51m in each group. All the outputs of AD51p for accumulating VH are input to AD52, and all the outputs of AD51m for accumulating VL are input to AD53. In FIG. 5, six(S/H)s from 51 to 56 are shown, which are divided into three groups. Generally a spreading code is a hundred or more bits, and sampling and holding circuits are provided by the number corresponding to the number of bits.

Figure 9:
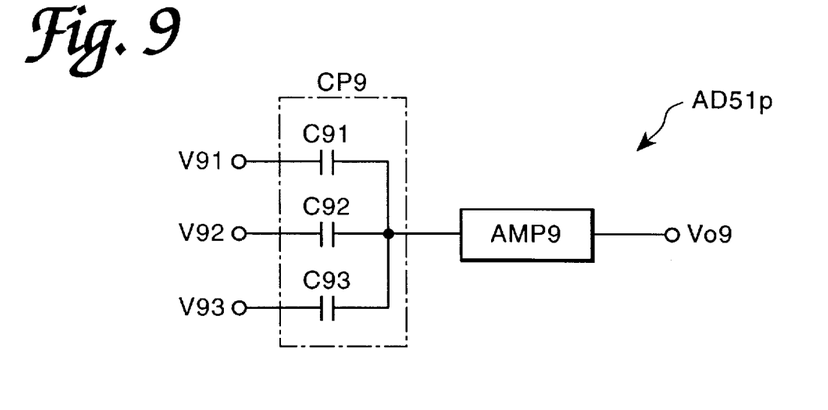
FIG. 9 shows a diagram of the first addition circuit of the second embodiment.

As shown in FIG. 9, addition portion AD51p (AD51 is the same) includes a capacitive coupling CP9 comprised of capacitances C91, C92 and C93 by the number corresponding to the number of a sampling and holding circuit. The output of CP9 is connected to AMP9, which is the same as AMP1, is output as output voltage Vo9 with good linearity. Assuming the input voltages of capacitances from C91 to C93 to be V91, V92 and V93, and a feedback capacitance of AMP9 is to be CP9. Vo9 of an output of AMP9 can be expressed in formula (7).

$$Vo9 = -\frac{C_{91}V_{91} + C_{92}V_{92} + C_{93}V_{93}}{CF_9} \quad (7)$$

Here, from V91 to V93 and Vo9 are the voltages relative to the basis of the reference voltage Vr, and it is settled that C91=C92=C93=CF9/3. Therefore a normalized output of inverted addition can be obtained as in formula (8).

$$Vo9 = -\frac{V_{91} + V_{92} + V_{93}}{3} \quad (8)$$

The maximum voltage exceeding the supply voltage is prevented by the normalization.

Figure 10:
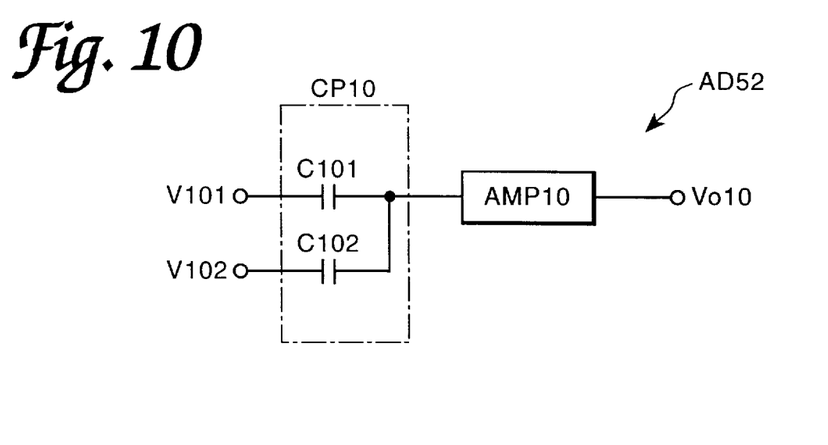
FIG. 10 shows a diagram of the second addition circuit of the second embodiment.

As in FIG. 10, the addition portion AD52 includes capacitive coupling CP10 having capacitances C101 and C102 corresponding to the number of connected AD51p or AD51m. An output of AD52 is connected to inverted amplifying portion AMP10 similar to AMP1. An output of CP10 is generated in the output of AMP10 with good linearity. Assuming input voltages of capacitances C101 and C102 to be V101 and V102, feedback capacitance of AMP10 to be CP10, Vo10 of the output of AMP10 is expressed as the formula (9).

$$Vo10 = -\frac{C_{101}V_{101} + C_{102}V_{102}}{CF_{10}} \quad (9)$$

Here it is settled that V101 and V102 are the voltages referencing the reference voltage Vr, and C101=C102=CF10/2. The normalized output of added value can be obtained as in formula (10).

$$Vo10 = -\frac{V_{101} + V_{102}}{2} \quad (10)$$

It is prevented that the maximum voltage exceeds the supply voltage.

Figure 11:
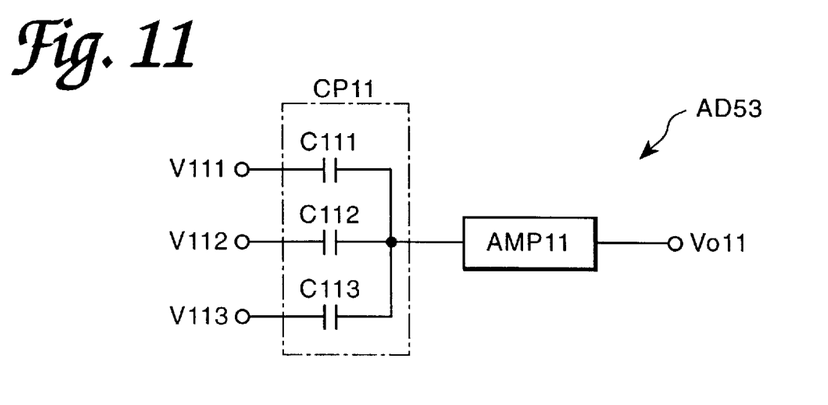
FIG. 11 shows a diagram of the third addition circuit of the second embodiment.

As in FIG. 11, addition portion AD53 includes a capacitive coupling CP11 having capacitances C111, C112 and C113 corresponding to the number of connected from AD51p or AD51m. An output of AD53 is connected to all inverted amplifying portion AMP11 similar to AMP1. An output of CP11 is generated in the output of AMP11 with good linearity. Assuming input voltages of capacitances C111, C112 and C113 (voltages referencing Vr) to be V111, V112 and V113, a feedback capacitance of AMP11 to be CF11, Vo11 of the output of AMP11 (relative to the basis of the reference voltage Vr) is expressed as the formula (11).

$$Vo11 = -\frac{C_{111}V_{111} + C_{112}V_{112} + C_{113}V_{113}}{CF_{11}} \quad (11)$$

Here it is defined that C111=C112=C113/2=CF11/2. The normalized output of inverted addition value can be obtained as in formula (12).

$$Vo11 = -\frac{V_{111} + V_{112} + V_{113}}{2} \quad (12)$$

The weight of C113 is settled as the twice of C111 and C112. It is for reducing influence of the normalization in AD52 on V10 and V11 which are unnormalized. The maximum voltage exceeding the supply voltage is prevented by the normalization above.

The operation by AD51p, AD51m, AD52 and AD53 are generated here. Assuming the signal S62 for i-th S/H5i to be 62(i) and the inversion thereof to be IS62(i), Vo10 of the output of AD52 is as in formula (13).

$$Vo10 = \frac{1}{N} \sum_{i=0}^{N-1} \frac{IS_{62}(i) + 1}{2} V(t - i\Delta t) \quad (13)$$

Vo11(t) of the output of AD53 is obtained by the operation in formula (14).

$$Vo11 = -\frac{1}{N} \left\{ NVo10 - \sum_{i=0}^{N-1} \frac{S_{62}(i) + 1}{2} V(t - i\Delta t) \right\} \quad (14)$$

That is, the operation in formula (15) is performed.

$$Vo11(t) = \frac{1}{N} \sum_{i=0}^{N-1} \frac{\{S_{62}(i)V(t - i\Delta t) - IS_{62}(i)V(t - i\Delta t)\}}{2} \quad (15)$$

Here, it is defined as below.
S2(i)=1 or −1
when S2(i)=1, IS2(i)=−1
when S2(i)=−1, IS2(i)=1

Figure 12:
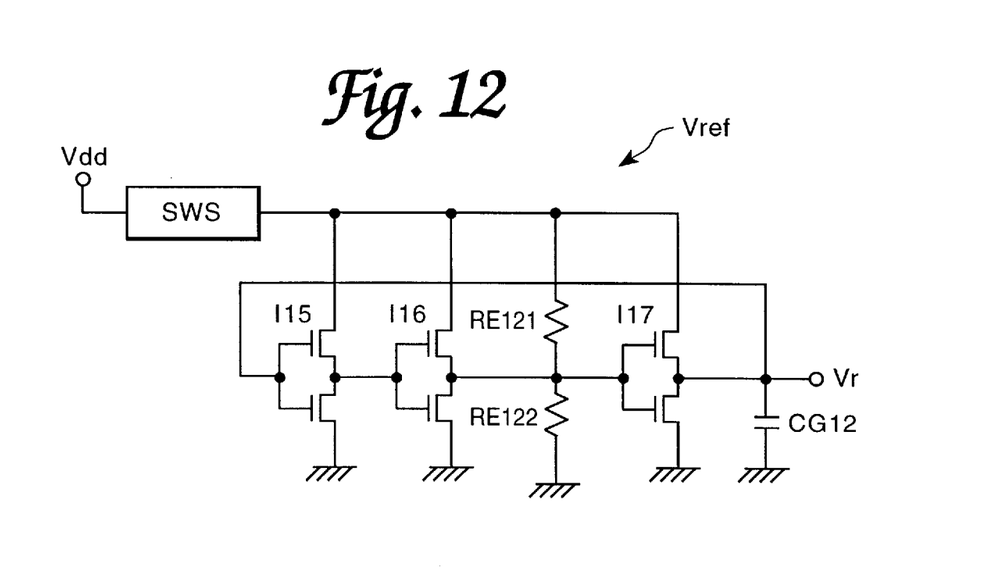
FIG. 12 shows a diagram of the reference voltage generating circuit.
Figure 13:
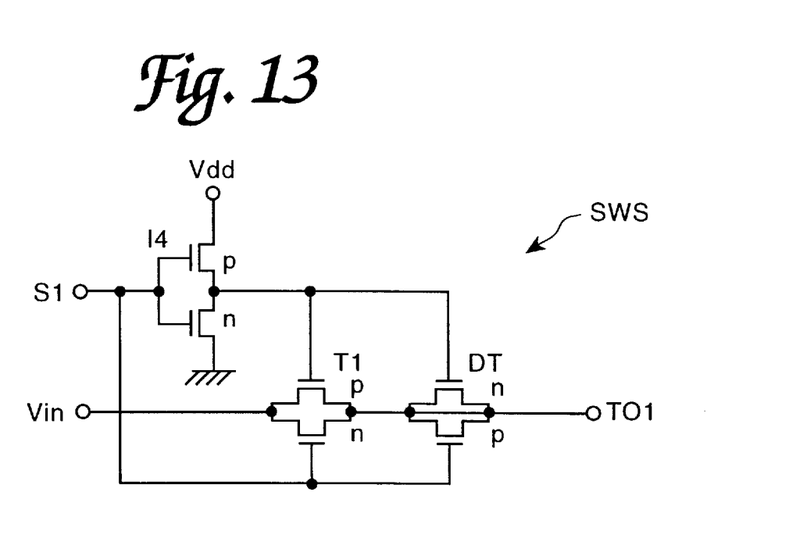
FIG. 13 shows a power switch common to the first and second embodiments

The reference voltage Vr is generated by a reference voltage generating circuit Vref in FIG. 12. The reference voltage generating circuit includes three stages serial inverters I15, I16 and I17, and an output of the last stage is fed back to the first stage input. Similar to the addition portions, unstable oscillation is prevented by a grounded capacitance CG12 and balancing resistances RE121 and RE122. The output of the reference voltage circuit converges to a stable point on which an input and output voltages are equal to each other, and any reference voltage can be generated by changing the threshold of each inverter. Generally, in many cases, it is settled that Vr=Vdd/2 in order to keep dynamic range enough large in both directions of plus and minus. Here, Vdd is the supply voltage of the MOS inverter.

Concerning to the matched filter circuit above, the size of the circuit is largely reduced comparing digital one, and processing speed is high because of parallel multiplication and addition. Since the inputs and outputs of the sampling and holding circuit and addition portion are all voltage signal, electric power consumption is low.

In the formula (15), new Vo11 is generated by holding the newest input signal Vin at the timing of every Δt in a sampling and holding circuit. In this case, electric power shown in formula (16) is consumed. In the formula, the constants are defined as below.

N: The number of taps.
W: The width of the window.
Ps: Electric power consumption per one sampling and holding circuit.
Pm: Electric power consumption per one multiplication circuit.
Pa: Electric power consumption in whole to an addition circuit.
Pt: Electric power consumption in the whole circuit.

$$pt = N^2(Ps + Pm) + NPa \quad (16)$$

It is not necessary for the matched filter used for despread to calculate N number of Vo11 of one cycle. Assuming the range of the search of aquisition to be W, the successive Vo11(t) of the number of W in Vo11(t) of the number of N is calculated and the rest number of (N−W) of Vo11(t) is the W times of calculations and (N−W) times of rest of calculations are alternatively repeated. Assuming a sampling and holding circuit which holds data on a time (t) to be SH(t), the process of the calculation can be decomposed into the steps below.

Step 2-1

When all SR, MUL and ADD are active and sampling and holding circuits from SH(1) to SH(N) have completed sampling and holding, SH(1) newly holds Vin for the calculation of Vo11(1) and for outputting it at the same time. Vo11(W) is calculated by repeating it.

Step 2-2

On the timing Vo11(Wt1). supplying power of circuits from SH(W+2) to SH(N) is stopped and from SH(2) to SH(W+1) is continued. New Vin is held by SH(W+1). On completing the holding, supply power to SH(W+2) is started and for holding the next data.

Step 2-3

Widening sampling and holding circuits to supply power as SH(W+2), SH(W+3), SH(N), successive input of Vin are newly held.

Step 2-4

On completion of holding Vo11(N), power supply is started for the circuits MUL and ADD as well as to SH(1).

Step 2-5

Returning to step 1, output from Vo11(1) to Vo11(W) are calculated and steps 2 to 5 are repeated.

The steps above is shown in Table 2 in the case of N=8 and W=3 in Table 2. A SH supplied power is shown by "○" and the rest of supplying power is shown by "X".

TABLE 2

Status of Circuits (Voltage is supplied or not.)

| SIGNAL  | SH(1) | SH(2) | SH(3) | SH(4) | SH(5) | SH(6) | SH(7) | SH(8) | ADD | MUL |
|---------|-------|-------|-------|-------|-------|-------|-------|-------|-----|-----|
| Vo11(1) | ○ | ○ | ○ | ○ | ○ | ○ | ○ | ○ | ○ | ○ |
| Vo11(2) | ○ | ○ | ○ | ○ | ○ | ○ | ○ | ○ | ○ | ○ |
| Vo11(3) | ○ | ○ | ○ | ○ | ○ | ○ | ○ | ○ | ○ | ○ |
| Vo11(4) | X | ○ | ○ | ○ | X | X | X | X | X | X |
| Vo11(5) | X | ○ | ○ | ○ | ○ | X | X | X | X | X |
| Vo11(6) | X | ○ | ○ | ○ | ○ | ○ | X | X | X | X |
| Vo11(7) | X | ○ | ○ | ○ | ○ | ○ | ○ | X | X | X |
| Vo11(8) | X | ○ | ○ | ○ | ○ | ○ | ○ | ○ | X | X |

Assuming the electrical power consumption stopped power supply to an unnecessary circuit and supplied power to a part of the circuit to be Pp the formula (17) is true.

$$Pp = Pt - \left\{ (N-W+1)\frac{N-W}{2} Ps + (N-W)NPm + (N-W)Pa \right\} \quad (17)$$

Assuming power ratio to be Rt=Pp/Pt, Rt can be shown as in Table 3 when S=128, W=1, 10 and 30. In Table 3, Rs, Rm and Ra are also shown, which are the electric power ratio concerning to a sampling and holding circuit, concerning to multiplication circuit, and concerning to addition circuit, respectively. Rt is calculated according to the number of operational amplifiers included in the sampling and holding circuits, multiplication circuits and addition circuit.

TABLE 3

Electric Power Ratio by Partial Power Supply

| W  | Rs  | Rm  | Ra  | Rt  |
|----|-----|-----|-----|-----|
| 1  | 50% | 1%  | 1%  | 50% |
| 10 | 57% | 8%  | 8%  | 57% |
| 30 | 70% | 23% | 23% | 70% |

As mentioned above, it is effective to reduce electric power by stopping performance of sampling and holding circuits. The electric power consumption can be a than conventional one.

The same effect can be obtained by stopping the connection of supply voltage Vdd for the multiplication circuit DM in a conventional digital matched filter in FIG. 14.

As mentioned above, in a matched filter circuit according to the present invention, electric power consumption is stopped with respect to an unnecessary circuit according to the experience that it is necessary to perform sampling only a part of signals after synchronous recognition. Paying attention to the dispersion code to be 1 bit data string, it is performed in the circuit of the present invention that an input signal is sampled and held as an analog signal according to the time, it is branched out into the signal groups "1" and "−1" by a multiplexer, the signals in each groups are added in parallel by a capacitive coupling, and the electric power is supplied in the circuit intermittently. Therefore, it is possible to control the power supply in the minimum be the present invention.

What is claimed is:

1. A matched filter circuit comprising:
   I) a plurality of sampling and holding circuits being connected in series to an input voltage, each said sampling and holding circuit comprising;
      i) a first inverted amplifying portion comprising,
         a) a first analog switch being connected to an input portion of said sampling and holding circuit,
         b) a first connecting capacitance being connected to an output of said first analog switch,
         c) an odd number of stages of MOS inverters being connected to an output of said first connecting capacitance, and
      ii) a first feedback capacitance connecting an output of said first inverted amplifying portion to an input portion of said MOS inverters;
   II) a plurality of multiplication circuit, corresponding to each said sampling and holding circuit, each said multiplication circuit comprising:
      i) a second inverted amplifying portion comprising,
         a) a plurality of a multiplexers, being connected in parallel to an output of said sampling and holding circuit corresponding thereto,
         b) a first capacitive coupling integrating outputs of said multiplexers, and
         c) an odd number of stages of MOS inverters being connected to an output of said first capacitive coupling, and
      ii) a second feedback capacitance connecting an output of said second inverted amplifying portion to an input portion of said MOS inverters of said second inverted amplifying portion; and
   III) an adder having a second capacitive coupling being connected to outputs of said multiplication circuits,
   wherein each said MOS inverters are connected to a power supply through a second analog switch.

2. A matched filter circuit as claimed in claim 1, said sampling and holding circuit further comprising;
   i) a third analog switch being connected to said output of said first inverted amplifying portion,
   ii) a second connecting capacitance being connected to all output of said third analog switch,
   iii) a third inverted amplifying portion including an odd number of stages of MOS inverters being connected to an output of said second connecting capacitance, and
   iv) a third feedback capacitance connecting an output of said third inverted amplifying portion to its input,
wherein said third analog switch is connected to said power supply through a fourth analog switch.

3. A matched filter circuit comprising:
   I) a plurality of sampling and holding circuits, each said sampling and holding circuit comprising:
      i) a first inverted amplifying portion comprising,
         a) a first analog switch being connected to an input voltage,
         b) a first connecting capacitances being connected to an output of said first analog switch, and
         c) an odd number of stages of MOS inverters being connected to an output of said first connecting capacitances,
      ii) a first feedback capacitances connecting an output of said first inverted amplifying portion to an input portion of said MOS inverters,
      iii) a first multiplexer alternatively outputting one of an output of said first inverted amplifying portion and a reference voltage, and
      iv) a second multiplexer alternatively outputting a voltage opposite to an output of said first multiplexer;
   II) a plurality of first adders, each first adder comprising;
      i) a plurality of second connecting capacitances being connected to outputs of said first multiplexers,
      ii) a second inverted amplifying portion having an odd number of stages of MOS inverters and receiving outputs of said second connecting capacitances, and
      iii) a second feedback capacitance connecting an output of said second inverted amplifying portion to its input;
   III) a plurality of second adders, each second adder comprising;
      i) a plurality of third connecting capacitances being connected to outputs of said second multiplexers,
      ii) a third inverted amplifying portion having an odd number of stages of MOS inverters and receiving outputs of said third connecting capacitances, and
      iii) a third feedback capacitance connecting an output of said third inverted amplifying portion to its input;
   IV) a control circuit closing said first analog switch of one of said sampling and holding circuits, while opening first analog switches of other sampling and holding circuits, and switching said first and second multiplexer of said sampling and holding circuits in a predetermined combination; and
   V) a second analog switch being provided to each of said first, second and third inverted amplifying portions, said MOS inverters in each of said first, second and third inverted amnplifing portions being connected to a power supply through a corresponding one of said second analog switches.

4. A matched filter circuit as claimed in claim 3, wherein said second sampling and holding circuit are divided into a plurality of groups, each group including corresponding said first and second adders and each group further comprising:
   a third adder being connected to outputs of said first adders, said third adder comprising;
      (a) a plurality of fourth connecting capacitances being connected to said outputs of each said first adders,
      (b) a fourth inverted amplifying portion having an odd number of stages of MOS inverters being connected to outputs of said fourth connecting capacitances, and
      (c) a fourth feedback capacitance connecting an output of said fourth inverted amplifying portion to its input;
   a fourth adder being connected to outputs of said second adders and an output of said third adder, said fourth adder comprising;
      (a) a plurality of fifth connecting capacitances being connected to said outputs of said second adders and said third adder,
      (b) a fifth inverted amplifying portion having an odd number of stages of MOS inverters being connected to outputs of said fifth connecting capacitances, and
      (c) a fifth feedback capacitance connecting an output of said fifth inverted amplifying portion to its input, and
   a third analog switch being provided for each of said fourth and fifth inverted amplifying portions, said MOS inverters in each of said fourth and fifth inverted amplifying portions being connected through a corresponding one of said third analog switches to said power source.

5. A matched filter circuit as claimed in claim 3, wherein a reference voltage is generated by a reference voltage generating circuit comprising:
   I) a sixth inverted amplifying portion having an odd number of stages of MOS inverters, and
   II) a feedback line connecting an output of said sixth inverted amplifying portion to its input.

6. A matched filter circuit as claimed in claim 1 or claim 3, wherein
   I) each inverted amplifying portion is connected at said output through a grounded capacitance to the ground, and
   II) each output of MOS inverter is connected to a supply voltage and the ground through a pair of balancing resistances of a stage before a last stage.

7. A matched filter circuit as claimed in claim 6, wherein said reference voltage is settled to ½ of a supply voltage of said MOS inverters.

8. A matched filter circuit as claimed in claim 3, wherein said control circuit switches all the sampling and holding circuits successively and circulatedly.

9. A matched filter circuit as claimed in claim 3, wherein number of said sampling and holding circuits to which said supply voltage is supplied is gradually increased after an aquisition from a predetermined number of said sampling and holding circuits centering an output peak of said matched filter to the total number.

10. A matched filter circuit as claimed in claim 3, wherein a number of said sampling and holding circuits to which said supply voltage is supplied is gradually increased after an acquisition from a predetermined number of said sampling and holding circuits to the total number.

* * * * *